United States Patent
Su et al.

(10) Patent No.: US 8,723,314 B2
(45) Date of Patent: May 13, 2014

(54) SEMICONDUCTOR WORKPIECE WITH BACKSIDE METALLIZATION AND METHODS OF DICING THE SAME

(75) Inventors: Michael Su, Round Rock, TX (US); Lei Fu, Austin, TX (US); Edward S. Alcid, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/408,102

(22) Filed: Feb. 29, 2012

(65) Prior Publication Data

US 2013/0221517 A1 Aug. 29, 2013

(51) Int. Cl.
*H01L 23/498* (2006.01)
*H01L 21/30* (2006.01)

(52) U.S. Cl.
USPC ............ 257/737; 257/620; 257/E21.499; 257/E21.599; 257/E21.6; 257/E21.602; 257/E21.604; 257/E21.606; 438/110; 438/113; 438/460; 438/462

(58) Field of Classification Search
USPC ............ 257/620, 737, E21.499, E21.599, 257/E21.6, E21.602, E21.604, E21.606; 438/110, 113, 460, 462
See application file for complete search history.

(56) References Cited

U.S. PATENT DOCUMENTS

| 7,052,975 | B2 | 5/2006 | Koizumi |
| 2005/0029628 | A1 | 2/2005 | Kurosawa |
| 2007/0119892 | A1* | 5/2007 | Horsfield ............ 225/2 |
| 2009/0057838 | A1 | 3/2009 | Arita et al. |
| 2009/0079038 | A1* | 3/2009 | Schneegans et al. ...... 257/620 |
| 2011/0227201 | A1 | 9/2011 | Too et al. |

FOREIGN PATENT DOCUMENTS

JP 2009-105211 A 5/2009

OTHER PUBLICATIONS

Keichi et al., JP 2009-105211, Published May 14, 2009, English Machine Translation, Retrieved Online Apr. 4, 2013.*
Disco Corporation; *Laser Application—7000 Series*; www.discousa.com/eg/products/catalog/pdf/dfl7000.pdf; Dec. 2, 2009; pp. 1-8.

* cited by examiner

*Primary Examiner* — Peniel M Gumedzoe
(74) *Attorney, Agent, or Firm* — Timothy M. Honeycutt

(57) ABSTRACT

Various semiconductor workpieces and methods of dicing the same are disclosed. In one aspect, a method of manufacturing is provided that includes forming a channel in a metallization structure on a backside of a semiconductor workpiece. The semiconductor workpiece includes a substrate. The channel is in substantial alignment with a dicing street on a front side of the semiconductor chip.

23 Claims, 5 Drawing Sheets

SEMICONDUCTOR WORKPIECE WITH BACKSIDE METALLIZATION AND METHODS OF DICING THE SAME

BACKGROUND OF THE INVENTION

1. Field of the Invention

This invention relates generally to semiconductor processing, and more particularly to semiconductor workpieces or wafers and to methods of dicing the same.

2. Description of the Related Art

Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. Many conventional semiconductor dice have four sides and four corners. The dicing operation is a mechanical cutting operation performed with a type of circular saw. Dicing saws are made with great care and operate more precisely than a comparable masonry circular saw.

Despite the aforementioned refinements, conventional dicing saw blades can still cause difficulties for certain types of semiconductor wafers and the chips cut from them. The problem stems from the structure of the wafer and chips. Many types of semiconductor chips dissipate sufficient levels of power that appropriate thermal management calls for the usage of solder-type thermal interface materials to convey heat to a heat spreader. Silicon typically does not exhibit favorable solder wettable properties. Accordingly, such semiconductor chips, and the wafers that spawn them, frequently include backside structure that may be a unitary or laminate structure of materials that provide a solder wettable interface between the semiconductor chip and the solder type thermal interface material. A difficulty associated with dicing of a semiconductor wafer that includes a backside metallization structure is the potential for the saw blade to kick flecks of the backside metallization structure up out of the semiconductor chip at the tail end of the dicing process for a given dicing street. These flecks may land harmlessly off of the semiconductor wafer. However, such flecks may also land on the front side of a semiconductor wafer and even onto solder bumps or onto two or more solder bumps at once, which can create a short between two or more bumps. Such shorts may persist even after a solder reflow process to mount the semiconductor chips to a circuit board of one sort or another.

The present invention is directed to overcoming or reducing the effects of one or more of the foregoing disadvantages.

SUMMARY OF THE INVENTION

In accordance with one aspect of the present invention, a method of manufacturing is provided that includes forming a channel in a metallization structure on a backside of a semiconductor workpiece. The semiconductor workpiece includes a substrate. The channel is in substantial alignment with a dicing street on a front side of the semiconductor chip.

In accordance with another aspect of the present invention, a method of manufacturing is provided that includes forming a metallization structure on a backside of semiconductor workpiece. The semiconductor workpiece includes a substrate, a front side and plural dicing streets. Plural channels are formed in the metallization structure. Each of the channels is in substantial alignment with one of the dicing streets.

In accordance with another aspect of the present invention, a semiconductor workpiece is provided that includes a substrate that has a front side and a backside. A dicing street is on the front side. A metallization structure is on the backside. The metallization structure includes a channel substantially aligned with the dicing street.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

A semiconductor workpiece, such as a wafer, includes backside metallization to facilitate, for example, solder thermal interface material wetting. Dicing streets populate the front side of a semiconductor workpiece. Plural channels are formed in the backside metallization structure in substantial alignment with the dicing streets. During dicing, the saw blade will encounter the channels and thus avoid throwing flecks of metal, which might otherwise land on the front side and short adjacent solder bumps. Additional details will now be described.

Figure 1:
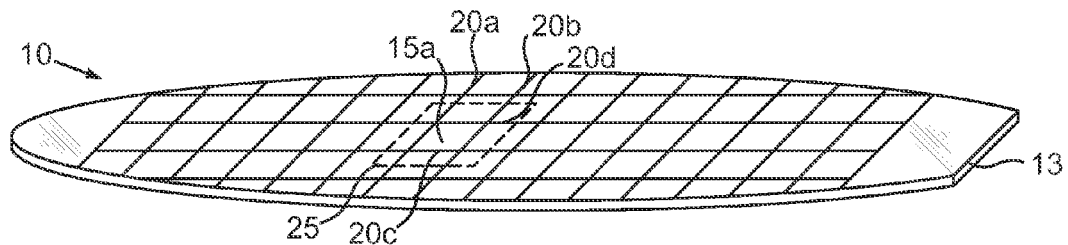
FIG. 1 is a pictorial view of an exemplary conventional semiconductor workpiece that may be a semiconductor wafer or other type of workpiece.

In the drawings described below, reference numerals are generally repeated where identical elements appear in more than one figure. Turning now to the drawings, and in particular to FIG. 1 which is a pictorial view of an exemplary embodiment of a conventional semiconductor workpiece 10 that may be a semiconductor wafer or other type of workpiece. The semiconductor workpiece may be constructed of silicon, germanium, gallium arsenide or other types of workpiece materials. Bulk semiconductor or semiconductor on insulator construction may be used. Even insulating materials are contemplated. The semiconductor workpiece 10 includes a flat 13 to facilitate spatial orientation and a plurality of semiconductor chips or dice, one of which is labeled 15a, that are bordered by intersecting dicing streets. For example, the semiconductor chip 15a is bordered by dicing streets 20a and 20b and intersecting dicing streets 20c and 20d. A saw blade or other cutting device (not visible in FIG. 1) will be used to cleave the semiconductor die 15a from the semiconductor workpiece 10 along the dicing streets 20a, 20b, 20c and 20d in a subsequent dicing operation. The skilled artisan will appreciate that the semiconductor workpiece 10 may include scores or more semiconductor chips like the chip 15a. To illustrate additional features of the conventional semiconductor workpiece 10, the portion is circumscribed by the dashed rectangle 25 will be shown isolated and at greater magnification in FIG. 2.

Figure 2:
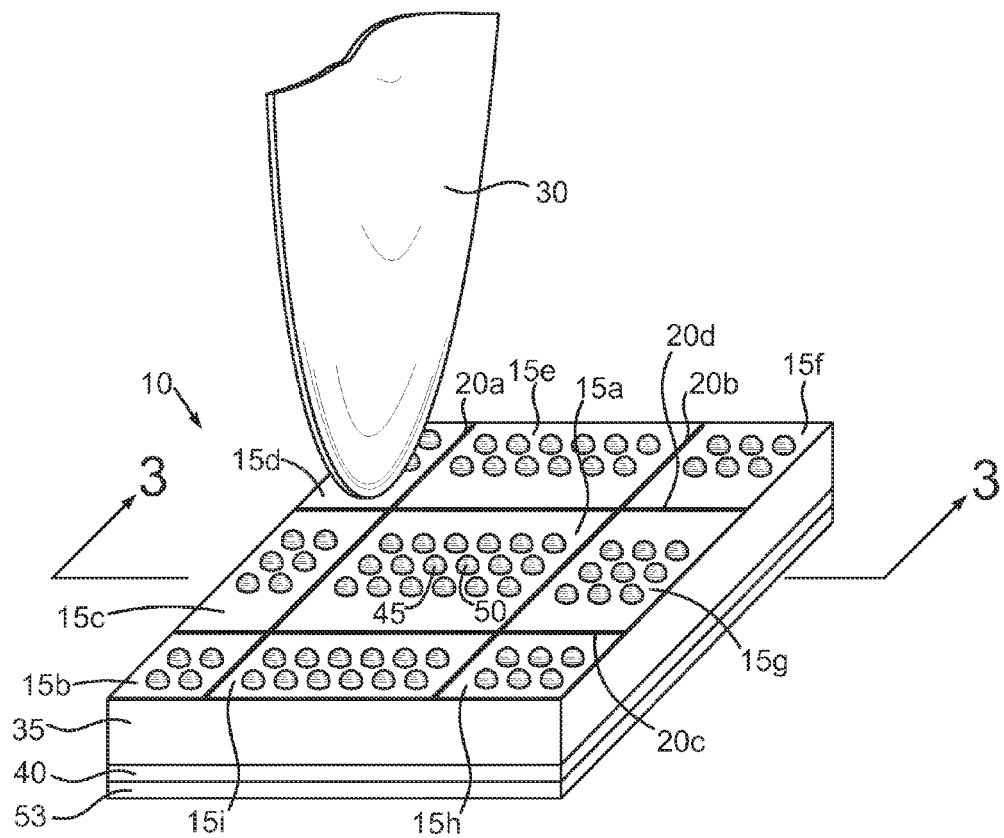
FIG. 2 is a pictorial view of a portion of the conventional semiconductor workpiece shown at greater magnification.

Attention is now turned to FIG. 2 which depicts the semiconductor chip 15a and portions of adjacent semiconductor chips 15b, 15c, 15d, 15e, 15f, 15g, 15h and 15i. The semiconductor chips 15a, 15b, 15c, 15d, 15e, 15f, 15g, 15h and 15i may be any of a large number of different types of circuit devices used in electronics, such as, for example, microprocessors, graphics processors, combined microprocessor/graphics processors, application specific integrated circuits, interposers, memory devices or the like, and may be single or multi-core.

As noted above, the semiconductor chip 15a is bordered by the dicing streets 20a, 20b, 20c and 20d. Here a dicing saw blade 30 is positioned over the dicing street 20a. Prior to dicing with the saw blade 30, the semiconductor workpiece 10 has undergone a multitude of processing steps to establish not only active circuitry (not visible) within the substrate 35 of the semiconductor workpiece 10 but also a backside metallization structure 40 and plural solder bumps. While each of the semiconductor chips 15a, 15b, 15c, 15d, 15e, 15f, 15g, 15h and 15i is provided with plural solder bumps, only two solder bumps 45 and 50 are separately labeled. The backside metallization structure 40 is formed on the backside of the substrate 35 of the semiconductor workpiece 10 to provide a solder-wettable surface to metallurgically bond with a solder-type thermal interface material (not shown) that will be used to transfer heat from the semiconductor chips 15a, 15b, 15c, 15d, 15e, 15f, 15g, 15h and 15i to a heat spreader of one form or another (not shown). The composition of the backside metallization structure 40 will depend on the composition of the solder-based thermal interface material. One example suitable for an indium-based thermal interface material includes, proceeding from top down, a gold film, a nickel-vanadium film, a titanium film and finally an aluminum film. Various deposition processes may be used. For example, aluminum and titanium may be sputtered while nickel-vanadium and gold may be plated. To temporarily hold the semiconductor chips 15a, 15b, 15c, 15d, 15e, 15f, 15g, 15h and 15i after dicing, an adhesive tape 53 is applied to the semiconductor workpiece 10 prior to dicing.

The solder bumps 45 and 50 may be fabricated from a variety of lead-based or lead-free solders. Examples of lead-based solders include compositions at or near eutectic proportions, such as about 63% tin and 37% lead. Lead-free examples include tin-silver (about 97.3% Sn 2.7% Ag), tin-copper (about 99% Sn 1% Cu), tin-silver-copper (about 96.5% Sn 3% Ag 0.5% Cu) or the like.

Figure 3:
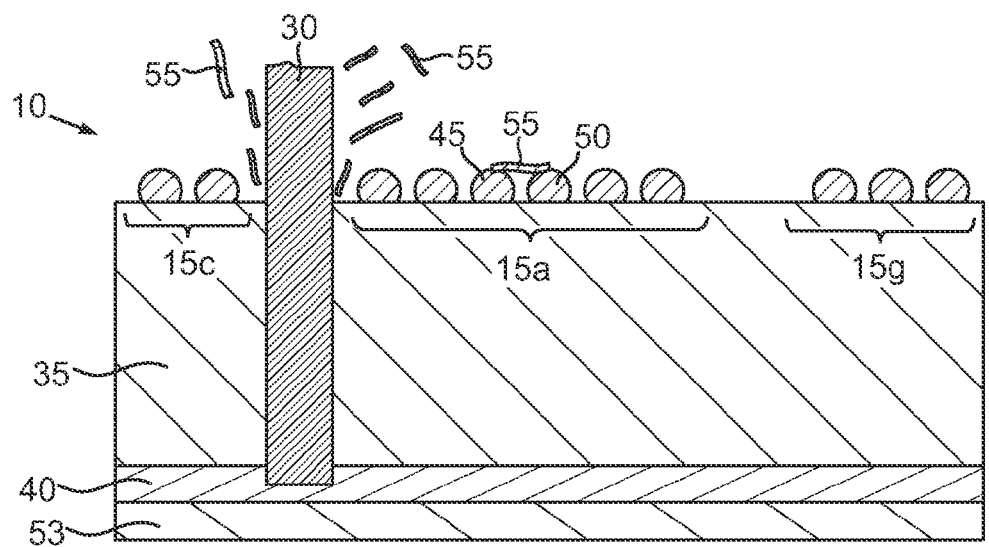
FIG. 3 is a sectional view of FIG. 2 taken at section 3-3.

A potential pitfall of a conventional dicing process performed on the conventional semiconductor workpiece 10 may be understood by referring now to FIG. 3, which is a sectional view of FIG. 2 taken at section 3-3. FIG. 3 depicts the semiconductor workpiece 10 at a point in the dicing operation where the saw blade 30 has penetrated the entirety of the substrate 35 of the semiconductor workpiece 10 and is proceeding into the backside metallization structure 40 toward the adhesive tape 53. As the blade 30 rotates and removes material from the backside metallization structure 40, flecks 55 of the backside metallization structure 40 may be kicked up. Unfortunately, some of the flecks 55 may settle on the solder bumps, such as the fleck 55 on the solder bumps 45 and 50. Such a fleck 55 creates a short between the solder bumps 45 and 50 that may persist even after a subsequent solder reflow process to connect the semiconductor chip 15a to a circuit board of one sort or another. Removal of such flecks 55 may be extremely difficult.

Figure 4:
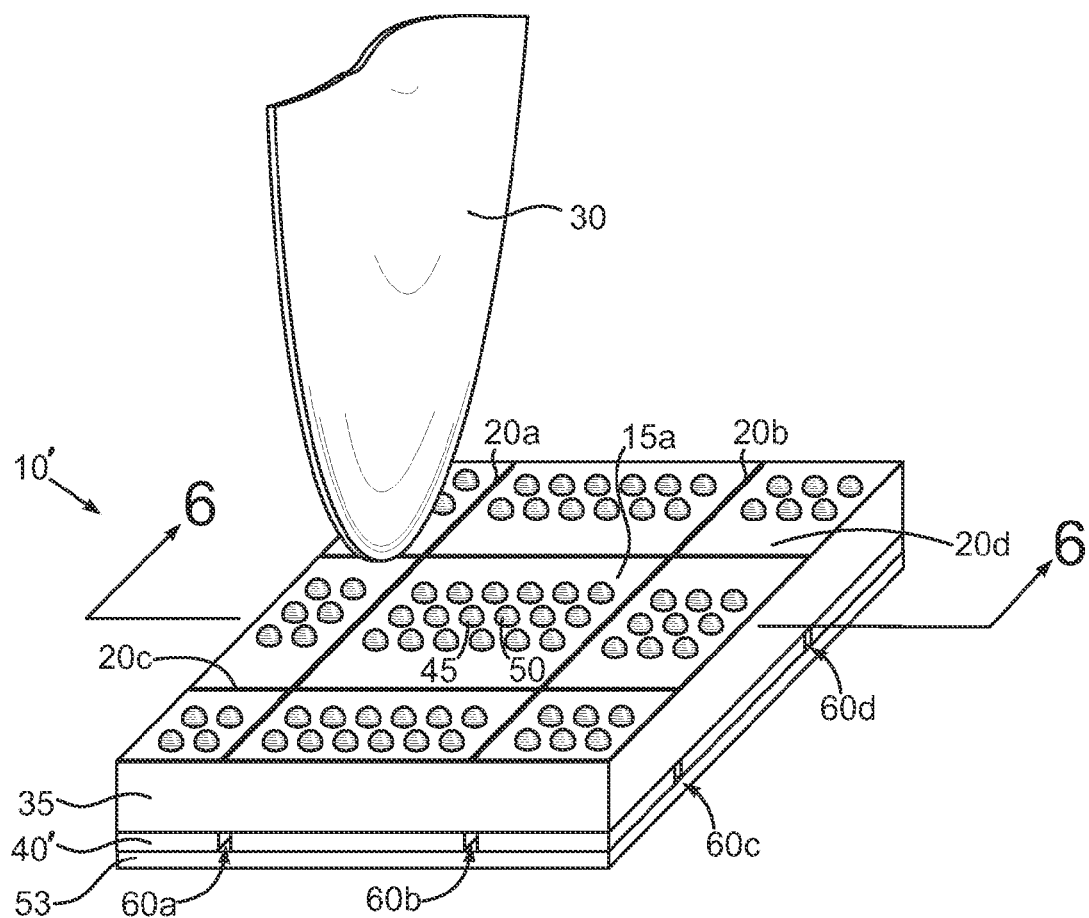
FIG. 4 is a pictorial view like FIG. 2, but of a portion of an exemplary embodiment of a semiconductor workpiece.
Figure 5:
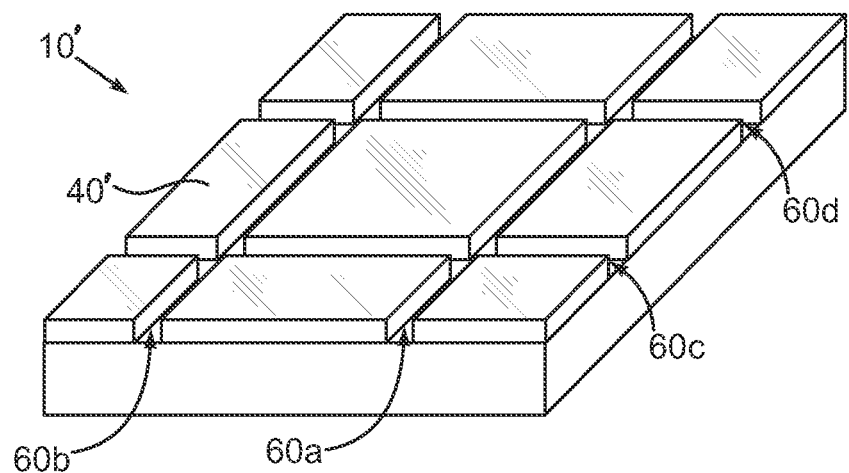
FIG. 5 is a pictorial of the portion depicted in FIG. 4 but flipped over.

An exemplary embodiment of a semiconductor workpiece or wafer 10' that includes features that are designed to eliminate or significantly reduce the propensity for backside metallization flecks to short front side solder structures may be understood by referring now to FIG. 4, which is a pictorial view like FIG. 2 but of the exemplary semiconductor workpiece 10. Again, FIG. 4 represents a small portion of what may be a much larger semiconductor workpiece. The semiconductor workpiece 10' may be substantially identical to the semiconductor workpiece 10 described above with an important difference to be described in more detail below. Thus, the semiconductor workpiece 10' may include the semiconductor chip 15a bordered by dicing streets 20a, 20b, 20c and 20d and a semiconductor substrate 35. Here, a backside metallization 40' may have the same material as the backside metallization 40 shown in FIG. 2 in composition and be fitted with the adhesive tape 53 for chip support prior to dicing. However, the backside metallization structure 40' advantageously includes plural channels 60a, 60b, 60c and 60d that are substantially aligned vertically with the dicing streets 20a, 20b, 20c and 20d. The channels 60a, 60b, 60c and 60d may be more readily seen in FIG. 5, which is a pictorial view of the semiconductor workpiece 10' shown in FIG. 4 but flipped over from the orientation of FIG. 4 and without the adhesive tape 53 in place. As described more fully below, the purpose of the channels 60a, 60b, 60c and 60d is to provide areas that are substantially devoid of metal so that the dicing saw 30 can cleave through the semiconductor substrate 35 without kicking up any flecks of the backside metallization 40'.

Figure 6:
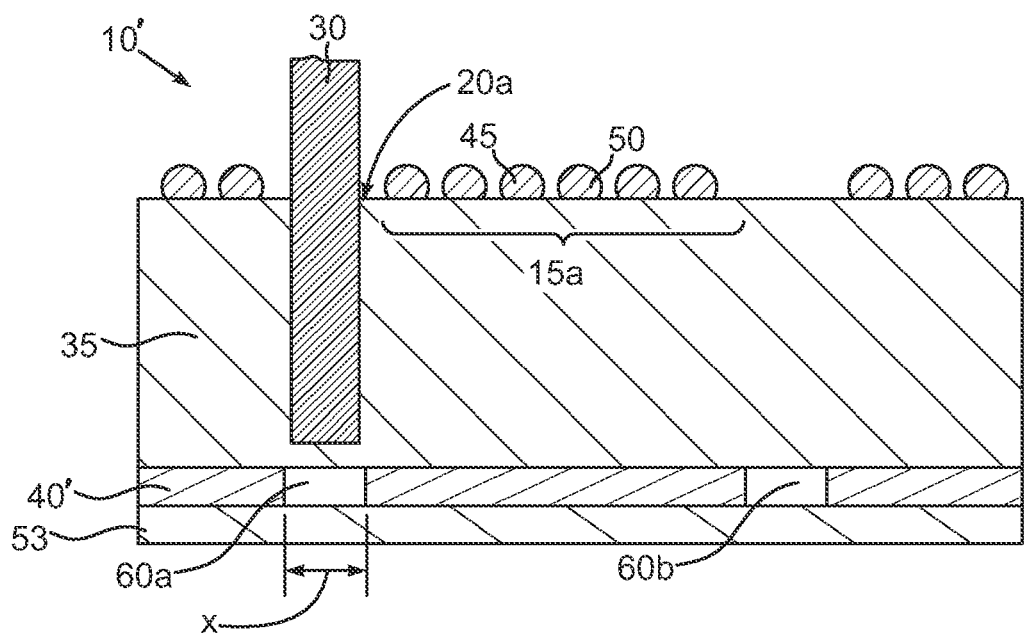
FIG. 6 is a sectional view of FIG. 4 taken at section 6-6.
Figure 7:
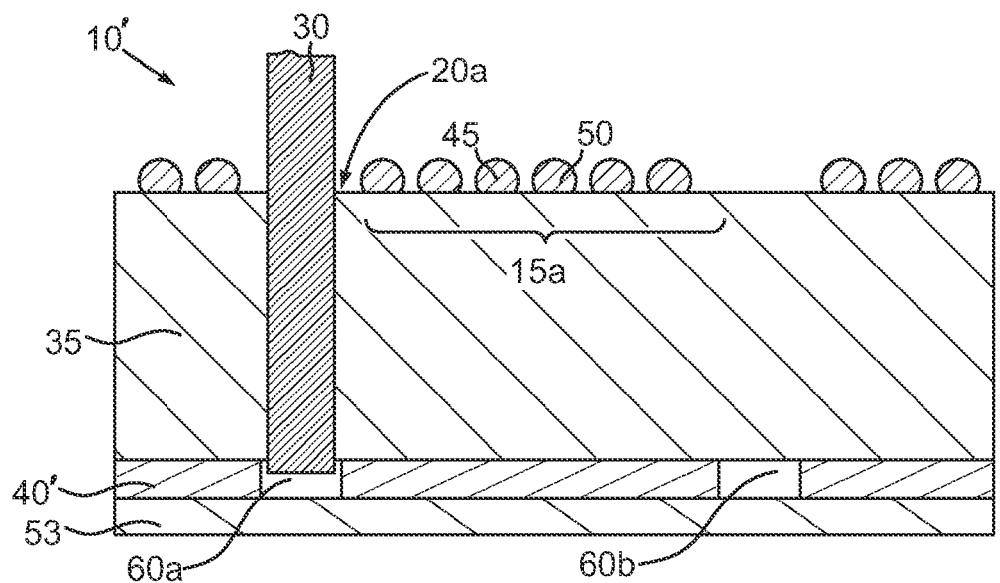
FIG. 7 is a sectional view like FIG. 6, but depicting dicing saw penetration of the semiconductor workpiece.

An exemplary dicing operation may be understood by referring now to FIG. 6, which is a sectional view of FIG. 4 taken at section 6-6, and FIG. 7, which is the same sectional view as FIG. 6 but depicting a later stage of dicing. FIG. 6 depicts the semiconductor workpiece 10' just before the saw blade 30 penetrates through the entirety of the substrate 35. As described above, the adhesive tape 53 is in place and the channel 60a is substantially aligned vertically with the dicing street 20a. The channel 60a and any of the other channels described herein may have some lateral dimension x that is advantageously at least as large as the anticipated width of the saw blade 30. Note that when the saw blade 30 completely penetrates the substrate 35, substantially no metal from the backside metallization 40 will be encountered due to the void established by the channel 60a. The same is true when dicing is performed in alignment with the channel 60b or any of the other channels 60c and 60d etc. Thus, the risk of any flecks landing on and shorting the solder bumps 45 and 50 of the semiconductor chip 15a, for example, is eliminated. The adhesive tape 53 can be separated from the semiconductor chip 15a following dicing.

Figure 8:
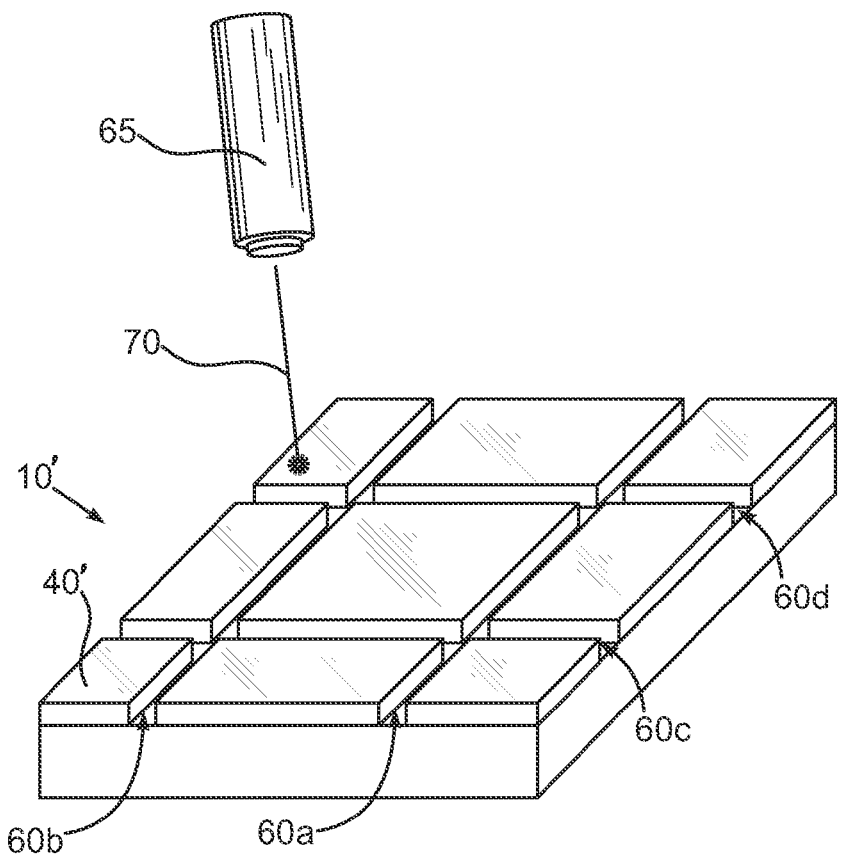
FIG. 8 is a pictorial view like FIG. 5, but depicting formation of backside channels.

The channels 60a, 60b, 60c and 60d may be formed in the backside metallization 40' in a variety of ways. For example, and as depicted in FIG. 8, the channels 60a, 60b, 60c and 60d may be formed in the backside metallization 40' by laser drilling with a laser source 65. The laser radiation 70 emitted therefrom may be pulse or continuous as desired. The power, wavelength and spot size of the laser radiation 70 may be tailored as desired to achieve desirable material removal rates, cutting accuracy and wafer heating. In an exemplary process, the power may be about 4 to 8 W, the wavelength may be about 200 to 400 nm, and the spot size may be about 10 to 20 nm. The laser cutting may liberate quantities of debris in the form of particles and condensates that may settle on the semiconductor workpiece 10'. Accordingly, well-known laser descumming techniques should follow the laser creation of the channels 60a, 60b, 60c and 60d.

Figure 9:
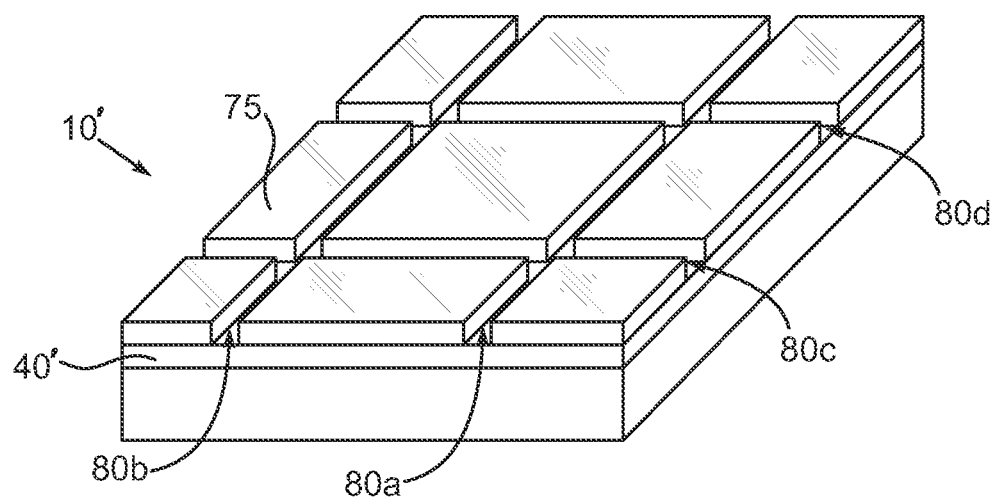
FIG. 9 is a pictorial view like FIG. 5, but depicting preliminary masking of a portion of the backside.
Figure 10:
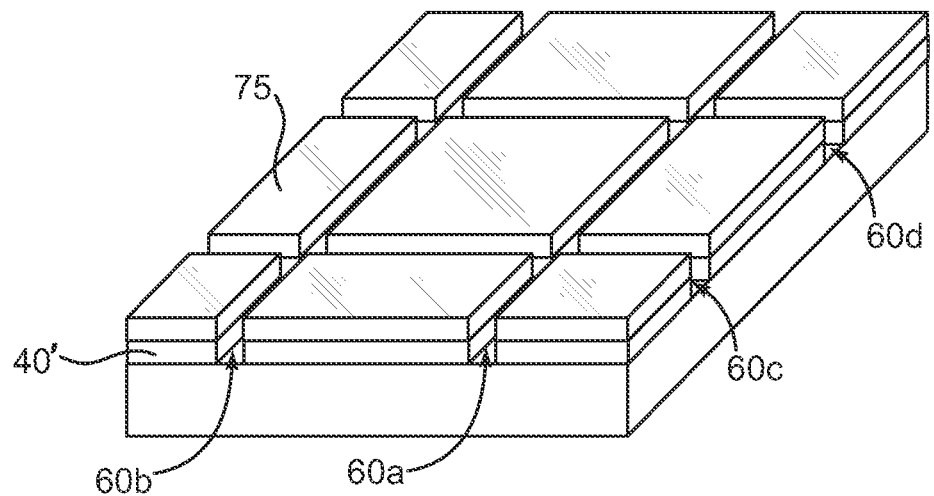
FIG. 10 is a pictorial view like FIG. 9, but depicting etching of the unmasked portion to form channels.

Techniques other than laser drilling may be used to establish the channels 60a, 60b, 60c and 60d. For example, and as depicted in FIG. 9, a suitable lithography mask 75 may be patterned on the uncut backside metallization structure 40' of the semiconductor workpiece 10' as shown. The lithography mask 75 is patterned with channels 80a, 80b, 80c and 80d that are positioned where the channels 60a, 60b, 60c and 60d shown in FIG. 10 will be formed by a subsequent material removal process, such as a wet or dry etch. The lithography mask 75 may be formed from well-known photoresist materials or even a hard mask material that is patterned appropriately. Thus, and as shown in FIG. 10, the material removal process establishes the channels 60a, 60b, 60c and 60d. Well-known wet or dry etch processes may be used to establish the channels 60a, 60b, 60c and 60d. The chemistry or chemistries selected for the etch processes should be selected to attack whatever materials make up the backside metallization structure 40'. For example, where gold, titanium, vanadium, nickel must be etched, etch gases such as $Cl_2$, $SF_6$, $CF_4$ and $CCl_4$ may be used. Following the material removal process, the lithography mask 75 may be removed by ashing, solvent stripping, combinations of the two or the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a channel in a metallization structure on a backside of a substrate of a semiconductor workpiece, the channel being in substantial alignment with a dicing street on a front side of the substrate and not extending into the backside of the substrate.

2. The method of claim 1, wherein the channel leads to the backside.

3. The method of claim 1, comprising forming the channel by laser cutting.

4. The method of claim 1, comprising forming the channel by masking a first portion of the metallization structure and etching the unmasked portion of the metallization structure.

5. The method of claim 1, comprising cutting at the dicing street through the substrate to the channel.

6. The method of claim 1, comprising forming plural solder bumps on a front side of the semiconductor workpiece.

7. The method of claim 1, wherein the semiconductor workpiece comprises a semiconductor wafer.

8. A method of manufacturing, comprising:
   forming a metallization structure on a backside of a substrate of a semiconductor workpiece, the semiconductor workpiece including, a front side and plural dicing streets; and
   forming plural channels in the metallization structure, each of the channels being in substantial alignment with one of the plural dicing streets and not extending into the backside of the substrate.

9. The method of claim 8, wherein each of the channels leads to the backside.

10. The method of claim 8, wherein at least some of the plural dicing streets intersect with one another to delineate plural semiconductor chips.

11. The method of claim 8, comprising forming the channels by laser cutting.

12. The method of claim 8, comprising forming the channels by masking a first portion of the metallization structure and etching the unmasked portion of the metallization structure.

13. The method of claim 8, comprising cutting at the dicing streets through the substrate to the channels.

14. The method of claim 8, comprising forming plural solder bumps on the front side of the semiconductor workpiece.

15. The method of claim 8, wherein the forming of the metallization structure comprises forming a laminate of metal layers.

16. The method of claim 8, wherein the semiconductor workpiece comprises a semiconductor wafer.

17. A semiconductor workpiece, comprising:
   a substrate having a front side and a backside;
   a dicing street on the front side; and
   a metallization structure on the backside, the metallization structure including a channel substantially aligned with the dicing street and not extending into the backside of the substrate.

18. The semiconductor workpiece of claim 17, wherein the channel leads to the backside.

19. The semiconductor workpiece of claim 17 wherein the semiconductor workpiece comprises a semiconductor wafer.

20. The semiconductor workpiece of claim 17, comprising plural solder bumps on the front side.

21. The semiconductor workpiece of claim 17, comprising a semiconductor chip on either side of the dicing street.

22. The semiconductor workpiece of claim 17, comprising plural dicing streets and plural channels substantially aligned with corresponding ones of the dicing streets.

23. The semiconductor workpiece of claim 17, wherein the metallization structure comprises a laminate of metal layers.

* * * * *